United States Patent
Beh et al.

(10) Patent No.: US 11,081,629 B2
(45) Date of Patent: Aug. 3, 2021

(54) LIGHT-EMITTING COMPONENT AND METHOD FOR PRODUCING A LIGHT-EMITTING COMPONENT

(71) Applicant: OSRAM Opto Semiconductors GmbH, Regensburg (DE)

(72) Inventors: Sok Gek Beh, Penang (MY); Ahmad Thibraani Termizi, Penang (MY); Mohd Fauzi Zainordin, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/645,519

(22) PCT Filed: Sep. 8, 2017

(86) PCT No.: PCT/EP2017/072612
§ 371 (c)(1),
(2) Date: Mar. 9, 2020

(87) PCT Pub. No.: WO2019/048054
PCT Pub. Date: Mar. 14, 2019

(65) Prior Publication Data
US 2020/0279984 A1     Sep. 3, 2020

(51) Int. Cl.
*H01L 33/60* (2010.01)
*H01L 33/00* (2010.01)
(Continued)

(52) U.S. Cl.
CPC .......... *H01L 33/60* (2013.01); *H01L 33/0095* (2013.01); *H01L 33/486* (2013.01); *H01L 33/54* (2013.01); *H01L 33/56* (2013.01)

(58) Field of Classification Search
CPC ......... H01L 33/60; H01L 33/54; H01L 33/62; H01L 33/486; H01L 33/483
See application file for complete search history.

(56) References Cited

U.S. PATENT DOCUMENTS

2015/0008467 A1 *   1/2015  Sawada ................. H01L 33/486
                                                 257/98
2017/0077361 A1     3/2017  Brandl et al.

FOREIGN PATENT DOCUMENTS

EP    2988341 A1    2/2016
JP    2008-84943 A  4/2008
(Continued)

OTHER PUBLICATIONS

An English translation of Office Action issued for corresponding Japanese Patent Application No. 2020-511279 dated Apr. 6, 2021.
(Continued)

*Primary Examiner* — Marcos D. Pizzaro
*Assistant Examiner* — Antonio B Crite
(74) *Attorney, Agent, or Firm* — Hauptman Ham, LLP

(57) ABSTRACT

A light-emitting component is provided which comprises a carrier, a reflective layer and a light source, wherein the light source is mechanically fixed on a mounting surface of the carrier. The carrier has an electrically isolating basic body comprising an edge region, said edge region bounding the mounting surface. The edge region comprises a recess, wherein the reflective layer covers a base surface of the recess. Moreover, the mounting surface is vertically elevated with respect to the base surface of the recess at least in places, such that the reflective layer is kept away from the mounting surface.
Furthermore, a method for producing such a light-emitting component is provided.

18 Claims, 9 Drawing Sheets

Figure 1A:
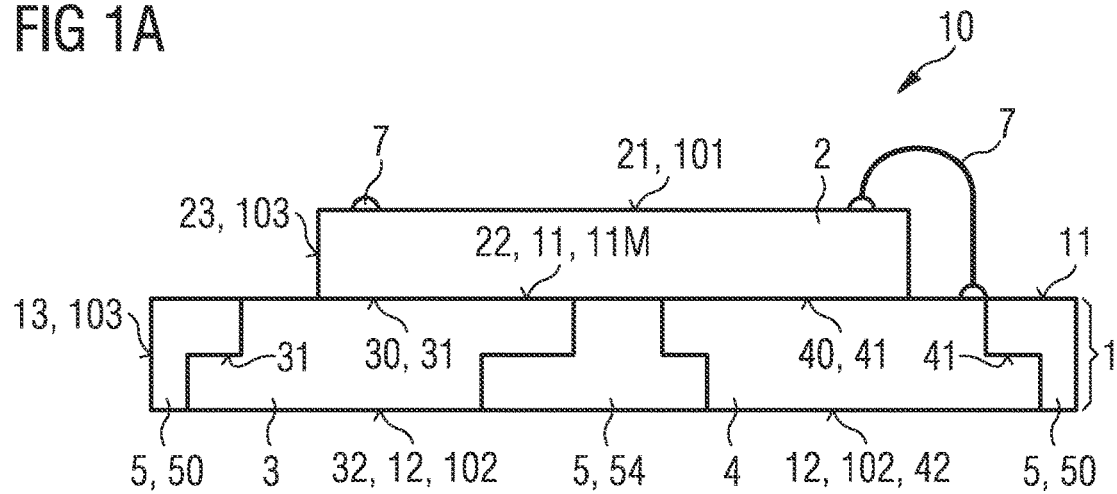

(51) Int. Cl.
　　　*H01L 33/48*　　　(2010.01)
　　　*H01L 33/54*　　　(2010.01)
　　　*H01L 33/56*　　　(2010.01)
　　　*H01L 33/62*　　　(2010.01)

(56) References Cited

FOREIGN PATENT DOCUMENTS

| | | |
|---|---|---|
| JP | 2012-174979 A | 9/2012 |
| JP | 2012-227294 A | 11/2012 |
| JP | 2013-149866 A | 8/2013 |
| JP | 2014-22491 A | 2/2014 |
| JP | 2016-146465 A | 8/2016 |
| JP | 2017-509155 A | 3/2017 |
| JP | 2017-76793 A | 4/2017 |
| KR | 10-2011-0060390 A | 6/2011 |

OTHER PUBLICATIONS

International Search Report issued for corresponding Patent Application No. PCT/EP2017/072612 dated Jan. 29, 2018, 3 pages, citing above references.
Written Opinion issued for corresponding Patent Application No. PCT/EP2017/072612 dated Jan. 29, 2018, 5 pages.

* cited by examiner

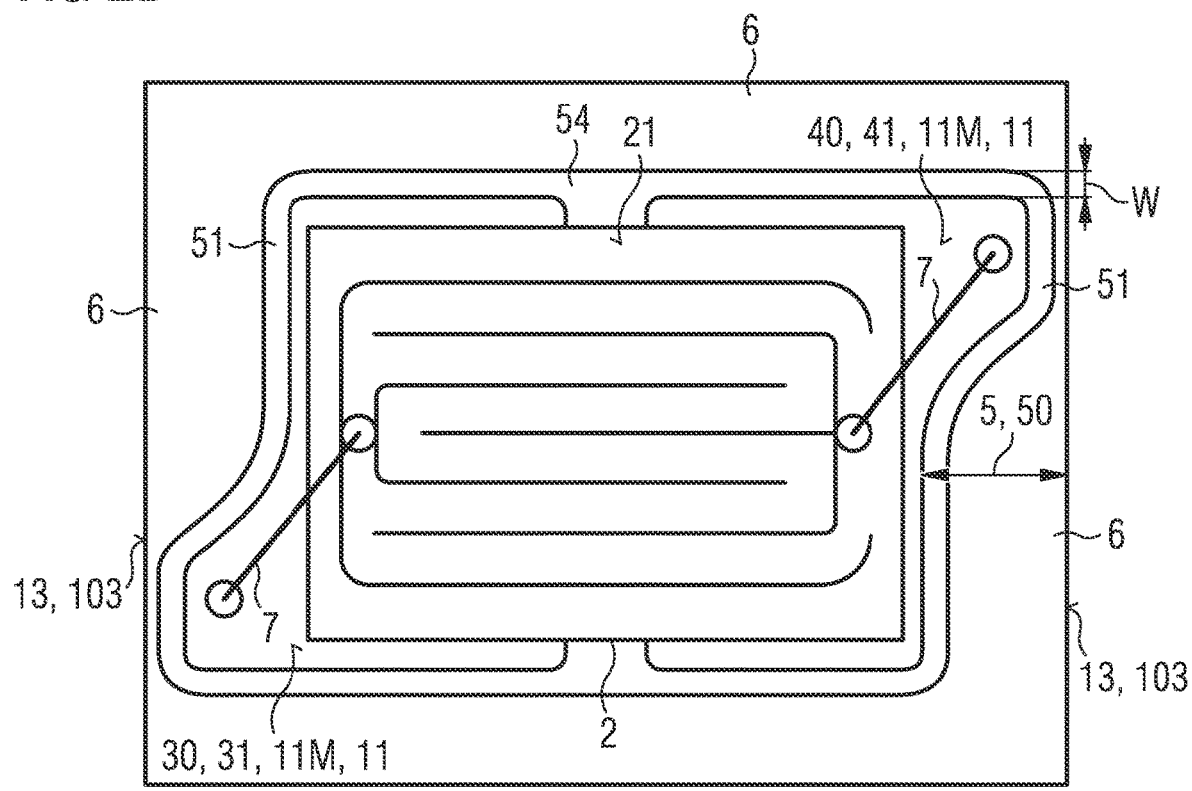

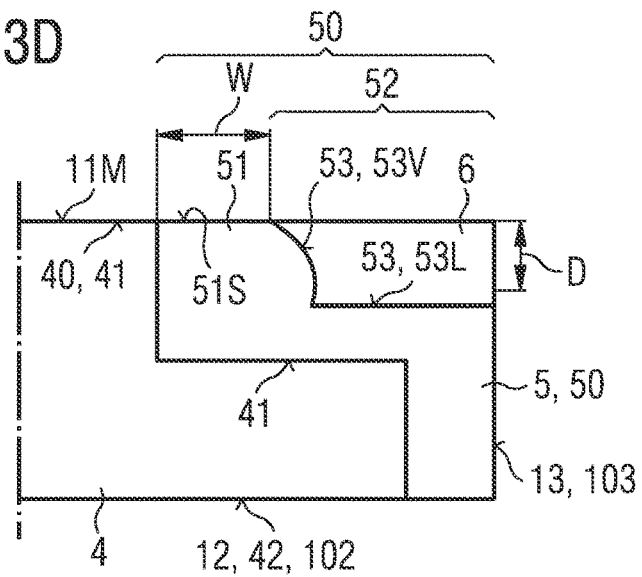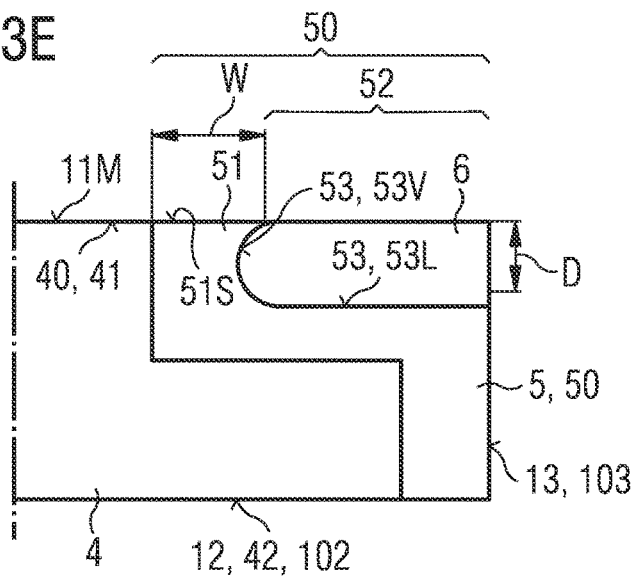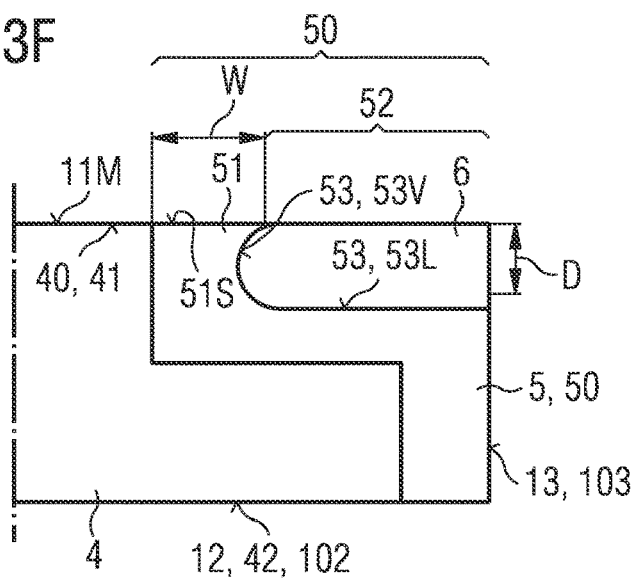

LIGHT-EMITTING COMPONENT AND METHOD FOR PRODUCING A LIGHT-EMITTING COMPONENT

CROSS REFERENCE TO RELATED APPLICATION

This application is the National Phase Application of International Application No. PCT/EP2017/072612, filed on Sep. 8, 2017, which designates the United States and was published in Europe. The document is hereby incorporated by reference in its entirety.

A light-emitting component is provided. A corresponding method for producing a light-emitting component or for producing a plurality of light-emitting components is also provided.

Optoelectronic packages having a housing and a light-emitting semiconductor chip usually suffer from loss of efficiency as a result of light absorptions at sidewalls of the housing or at a mounting surface on which the light-emitting chip is fixed.

An object to be achieved is to provide a light-emitting component having an increased efficiency. Another object to be achieved is to provide a method by means of which a light-emitting component or a plurality of light-emitting components can be produced in a cost-efficient manner.

According to at least one embodiment of a light-emitting component, the component comprises a carrier and a light source, wherein the light source is mechanically fixed on a mounting surface of the carrier. The light-emitting component is for example a semiconductor component. The light source is in particular a semiconductor chip, for example a light-emitting diode (LED) or an organic light-emitting diode (OLED). For example, the light source has one single or a plurality of semiconductor chips. The carrier may comprise a plurality of connection pads and/or conductor tracks for electrically contacting the light source. In particular, the connection pads and/or the conductor tracks are formed at least partially or completely on the mounting surface. It is possible that the mounting surface is formed at least in places by surfaces of the connection pads. The light-emitting component can have a plurality of light-emitting chips, which are arranged for example on the same mounting surface.

A mounting surface is to be understood to mean a surface of the carrier for receiving the light source, for example one or a plurality of the light-emitting chips. The mounting surface may comprise several connection pads, for example two connection pads, assigned to different electrical polarities. In particular, the connection pads of different electrical polarities are spatially separated from each other. The light source fixed on the mounting surface is situated in particular completely within the mounting surface.

Preferably, the mounting surface is adapted to the light source in such a way that at least 30%, 40%, 50%, 60%, 70%, 80%, 85% or at least 90% of the mounting surface are covered by the light source, for example by one single light-emitting chip or by a plurality of light-emitting chips.

According to at least one embodiment of the light-emitting component, the carrier has an electrically isolating basic body. The electrically isolating basic body is formed for example from a synthetic resin, in particular from a casting compound such as an epoxy resin molding compound. The basic body can be a mold body which may be formed by a molding process.

According to at least one embodiment of the light-emitting component, the carrier comprises an edge region, wherein the edge region surrounds and in particular delimits the mounting surface in lateral directions. The edge region of the carrier may be formed by an edge region of the basic body. The edge region is in particular that region of the carrier and/or of the basic body which directly adjoins the mounting surface and extends along one lateral direction as far as one side surface of the carrier or extends along all lateral directions as far as the corresponding side surfaces of the carrier.

A lateral direction is to be understood to mean a direction extending parallel to the mounting surface. A vertical direction is to be understood to mean a direction that is perpendicular to the mounting surface. In particular, the lateral direction and the vertical direction are perpendicular to each other.

According to at least one embodiment of the light-emitting component, the edge region of the carrier or of the basic body comprises a recess. The recess may extend laterally as far as one side surface or as far as all side surfaces of the basic body and/or of the carrier and/or of the light-emitting component. The recess has a base surface. In particular, the whole base surface of the recess is formed exclusively by surfaces of the basic body. The recess may be an indentation or a cutout of the basic body. In a top view onto the carrier, the mounting surface may be framed by the recess. For example, the mounting surface is surrounded by the recess completely.

According to at least one embodiment of the light-emitting component, the mounting surface is vertically elevated with respect to the base surface of the recess at least in places. The base surface comprises for example a first vertically extending section and a second laterally extending section. The mounting surface is vertically elevated in particular to the second section of the base surface, while the first portion extends along the vertical direction from the second lateral section to the vertical level of the mounting surface. For example, the recess has an average depth of at least 30 µm, 50 µm, 70 µm or 90 µm. The maximal depth of the recess may be at most 120 µm, 150 µm, 180 µm, 200 µm, 300 µm or 400 µm or 500 µm.

According to at least one embodiment of the light-emitting component, the component comprises a reflective layer. The reflective layer fills up the recess partially or completely. In top view, the reflective layer covers the base surface of the recess, in particular completely. For example, the recess and the filling level of the reflective layer are formed in such a way that between 40% and 85% inclusive, in particular between 50% and 85% inclusive or between 60% and 75% inclusive of the total front side of the basic body are covered by the reflective layer. The mounting surface and/or the light source, however, are preferably not covered by the reflective layer. Thus, by means of the recess, the reflective layer may be kept away from the mounting surface.

In accordance with one embodiment of a light-emitting component, the component comprises a carrier, a reflective layer and a light source. The light source is mechanically fixed on a mounting surface of the carrier. The carrier has an electrically isolating basic body comprising an edge region, wherein the edge region bounds the mounting surface. The edge region comprises a recess, wherein the reflective layer covers a base surface of the recess. The mounting surface is vertically elevated with respect to the base surface of the recess at least in places, such that the reflective layer is kept away from the mounting surface.

The recess may act as a collecting basin for the reflective layer and prevents a material of the reflective layer from creeping onto the mounting surface or onto side surfaces of the light-emitting chip. The light-emitting chip may be a volume emitter, which means that light generated by the light-emitting chip may exit the light-emitting chip not only at its front side but also at its lateral surfaces. A reduction in the efficiency of the light-emitting component can be avoided if the front side and/or the side surfaces of the light-emitting chip are free of any material of the reflective layer. Moreover, since the front side of the carrier is partially covered by the reflective layer in the edge regions surrounding the mounting surface, light generated by the light-emitting chip and impinging on the front side of the carrier may be re-directed in a forward direction. As a result, the overall efficiency of the light-emitting component may be enhanced.

According to at least one embodiment of the light-emitting component, the edge region comprises a spacer, wherein the spacer is arranged laterally between the mounting surface and the recess. The spacer is formed in particular as a part, in particular as an integral part, of the basic body. The basic body may be formed in one piece, wherein the spacer is an integral part of the basic body. For example, the spacer adjoins the mounting surface directly. In other words, the lateral extension of the mounting surface is delimited by the spacer. The spacer may surround the mounting surface completely. In particular, the spacer and the mounting surface are at the same vertical height level within the scope of the production tolerances. In this case the spacer and the mounting surface may close flush with each other along the vertical direction. It is possible that the mounting surface is elevated with respect to the spacer, wherein a top surface, i.e. a laterally extending surface, of the spacer is elevated with respect to a base surface of the recess. For example, the mounting surface and/or the top surface of the spacer are/is vertically elevated with respect to the base surface of the recess by at least 50 μm.

According to at least one embodiment of the light-emitting component, the spacer has a lateral width, in particular an average lateral width of at least 20 μm or at least 30 μm or 50 μm. A lateral width of the spacer is to be understood to mean a lateral extension, in particular an average lateral extension, of the spacer. The average lateral extension of the spacer determines for example an average distance between the mounting surface and the recess or between the mounting surface and the reflective layer. The lateral width of the spacer may be at most 300 μm, 200 μm, 150 μm, 100 μm or 70 μm.

According to at least one embodiment of the light-emitting component, the spacer and the recess adjoin each other, in particular directly. In lateral directions towards the mounting surface, the recess is delimited for instance by the spacer. The base surface of the recess may have a vertically extending section and a laterally extending section. The laterally extending section may run smoothly into the vertically extending section, in particular without forming a kink or a jump. It is possible that the base surface is formed locally or globally oblique to the mounting surface.

According to at least one embodiment of the light-emitting component, the base surface, in particular the vertically extending section of the base surface, of the recess stretches along the vertical direction as far as the laterally extending surface of the spacer. In a top view onto the carrier, the laterally extending surface of the spacer and the base surface, in particular the vertically extending section of the base surface, are free of overlaps. Such a recess may be formed in a simplified way, for example by forming an indentation into the basic body in particular during a curing process by pressing or by material removal of the basic body.

According to at least one embodiment of the light-emitting component, the base surface, in particular the vertically extending section of the base surface, is convexly or concavely curved. The vertically extending section may stretch along the vertical direction from the laterally extending section to the laterally extending surface of the spacer. In particular the vertically extending section of the base surface is globally convex or globally concave.

According to at least one embodiment of the light-emitting component, in a top view onto the carrier, the laterally extending surface of the spacer and the base surface, in particular the vertically extending section of the base surface, overlap each other in places. The vertically extending section of the base surface may be covered completely by the spacer, in particular by the top surface of the spacer. In this case, even if the recess is filled out with the reflective layer, it is still extremely difficult for the material of the reflective layer to creep onto the spacer or onto the mounting surface.

According to at least one embodiment of the light-emitting component, the spacer and the recess form a step. The laterally extending surface of the spacer and the mounting surface may be flush with each other. The laterally extending surface of the spacer and the mounting surface are in particular vertically elevated with respect to the recess, for example to the base surface of the recess. The step or the spacer may act as a dam preventing the material of the reflective layer from creeping onto the mounting surface.

According to at least one embodiment of the light-emitting component, in a top view onto the carrier, the recess or the reflective layer extends from the spacer along at least one lateral direction as far as a side surface of the basic body or of the carrier or of the component. The recess and/or the reflective layer may extend from the spacer along all lateral directions as far as the corresponding side surfaces of the basic body or of the carrier or of the component. In a top view onto the carrier, for example at least 30%, 40%, 50%, 60%, 70% or 80% of the electrically isolating basic body are covered by the reflective layer. The coverage ratio may be between 50% and 85% inclusive. The reflective layer may fill out the recess partially or completely.

It is possible that the light source covers an intermediate portion of the basic body, wherein the intermediate portion is not covered by the reflective layer. The intermediate portion of the basic body is configured for example for electrically isolating different lead frames or different connection pads from each other. The mounting surface may be formed in places by a surface of the intermediate portion of the basic body. It is possible that, in a top view onto the carrier, at least 40%, 50%, 60%, 70%, 80% or 90% of the electrically isolating basic body are covered by the reflective layer or by the light source. The coverage ratio in this case may be between 60% and 95% inclusive.

According to at least one embodiment of the light-emitting component, the reflective layer is electrically isolating. For example, the reflective layer comprises a matrix material having white particles embedded therein. Preferably, the proportion of white particles within the matrix material is chosen such that the reflective layer has a reflectivity of greater than 90%, 92% or greater than 95%, for example with respect to visible light. The matrix material is in particular radiation-transmissive, preferably transparent to visible light. For example, the white particles are provided in the reflective layer in a proportion of up to at most 40%, 50%, 60%, 70% or 80% by volume and/or weight. Preferably the white particles are provided in the reflective layer in a proportion of down to at least 50%, 40%, 30%, 25% or 10%, by volume and/or weight.

According to at least one embodiment of the light-emitting component, the white particles are TiO2-particles. The matrix material can be made of silicone or is silicone.

According to at least one embodiment of the light-emitting component, the electrically isolating basic body is an epoxy resin mold compound. It has been found out that by introducing white particles into the basic body made of an epoxy resin mold compound it is hardly possible to increase the reflectivity of the basic body to 80% or to 90% while simultaneously keeping up the necessary mechanical stability of the basic body and/or of the carrier.

According to at least one embodiment of the light-emitting component, the electrically isolating basic body and the reflective layer have different material compositions. For example, the basic body and the reflective layer comprise different matrix materials and/or different proportions of white particles.

According to at least one embodiment of the light-emitting component, the carrier comprises a first lead frame and a second lead frame. The basic body is formed in particular as one piece and surrounds the first lead frame as well as the second lead frame in lateral directions. For example, the first and second lead frames are laterally separated by an intermediate portion of the basic body. The mounting surface may be formed in places by surfaces of the first lead frame, the second lead frame and of the intermediate portion of the basic body. The surface of the first lead frame and the surface of the second lead frame may form a first connection pad and a second connection pad of the mounting surface, respectively. The light source may be arranged on the mounting surface in such a way that the light source covers only the first connection pad, only the second connection pad or both the first and the second connection pads. It is possible that the light source covers the intermediate portion of the basic body.

According to at least one embodiment of the light-emitting component, the first lead frame and/or the second lead frame extend/extends throughout the basic body. The carrier comprises a rear side being remote from a front side comprising the mounting surface. The first lead frame and/or the second lead frame are/is preferably electrically contactable on the rear side of the carrier or on the rear side of the component. The mounting surface is remote from the rear side and may be formed in places by a surface of the first lead frame and/or by a surface of the second lead frame on the front side of the carrier.

According to at least one embodiment of the light-emitting component, the basic body, the first lead frame and the second lead frame close flush with one another at least in places at the mounting surface and/or at the rear side of the carrier. The first lead frame and/or the second lead frame may be formed flush with the spacer at the mounting surface and/or with the intermediate portion of the basic body at the front side and/or at the rear side of the carrier.

According to at least one embodiment of the light-emitting component, the mounting surface accounts for between 30% and 80% inclusive, for example between 30% and 70% or between 30% and 50% inclusive, of a total surface of the carrier.

According to at least one embodiment of the light-emitting component, the electrically isolating basic body and the reflective layer close flush with one another laterally. In particular, the side surfaces of the component are formed in places by the side surfaces of the basic body. The reflective layer may extend laterally from the mounting surface or from the spacer of the basic body as far as the side surfaces of the basic body or of the component.

According to at least one embodiment of the light-emitting component, the component comprises a radiation-transmissive, in particular transparent, encapsulation layer. In top view, the encapsulation layer may cover the carrier, the reflective layer and the light source completely. It is possible that scattering particles and/or phosphor particles are dispersed within the encapsulation layer. The side surfaces of the component may be formed in places by the side surfaces of the encapsulation layer and/or of the reflective layer and/or of the basic body.

Preferably, the encapsulation layer comprises silicone or is made of silicone. The reflective layer may comprise silicone and white particles dispersed therein. In particular, the encapsulation layer adjoins the reflective layer. An interface between the encapsulation layer and the reflective layer is in particular a silicone-silicone-interface. Such an interface has a higher adhesion strength compared to a silicone-epoxy-interface and prevents the encapsulation layer from being delaminated from the component.

According to at least one embodiment of the light-emitting component, the component is a Quad Flat No-leads package (QFN package). The component is in particular free of leads on side surfaces of the component. The component is for example surface-mountable. In particular the component is electrically contactable exclusively via the rear side of the component.

In accordance with one embodiment of a method for producing a light-emitting component, in particular for producing a light-emitting component as described herein, the light source is fixed on the mounting surface of the carrier. The reflective layer is applied onto the edge region of the electrically isolating basic body in particular by a dispensing process and for example before or after the light source has been electrically contacted. Preferably, the reflective layer is formed in such a way that the reflective layer does not cover the mounting surface and/or the light source.

In accordance with one embodiment of a method for producing a plurality of light-emitting components, a plurality of recesses is formed on the basic body of a common carrier. The recesses may be formed in such a way that they surround a plurality of mounting surfaces on the common carrier. A plurality of light sources is fixed on the plurality of mounting surfaces. The recesses may be filled with the reflective layer after or prior to the fixing of the light sources.

According to at least one embodiment of the method, a common encapsulation layer is applied onto the common carrier by a molding process, in particular by a compression molding process, such that the common encapsulation layer covers the light sources and the reflective layers completely. For example, the encapsulation layer is a silicone layer.

In particular, after the reflective layer and/or the common encapsulation layer have been applied and cured, the common encapsulation layer and the common carrier may be singulated along the recesses into a plurality of light-emitting components, wherein each light-emitting component may comprise one carrier, one light source and one reflective layer.

Such a light-emitting component may be produced by the methods described herein. Therefore, features described in connection with the methods for producing a light-emitting component or a plurality of light-emitting components can also be used for the light-emitting component, and vice versa.

Figure 1B:
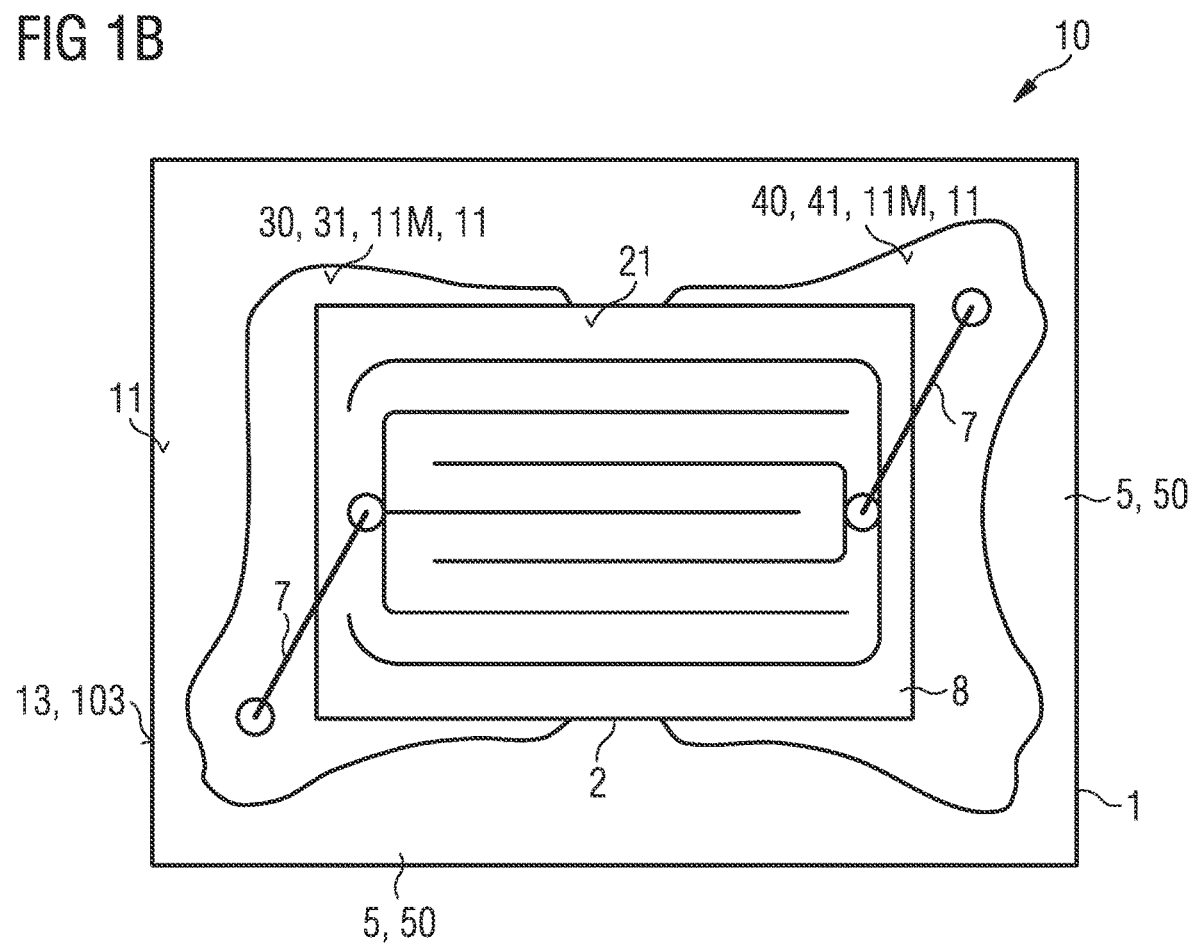
Figure 2A:
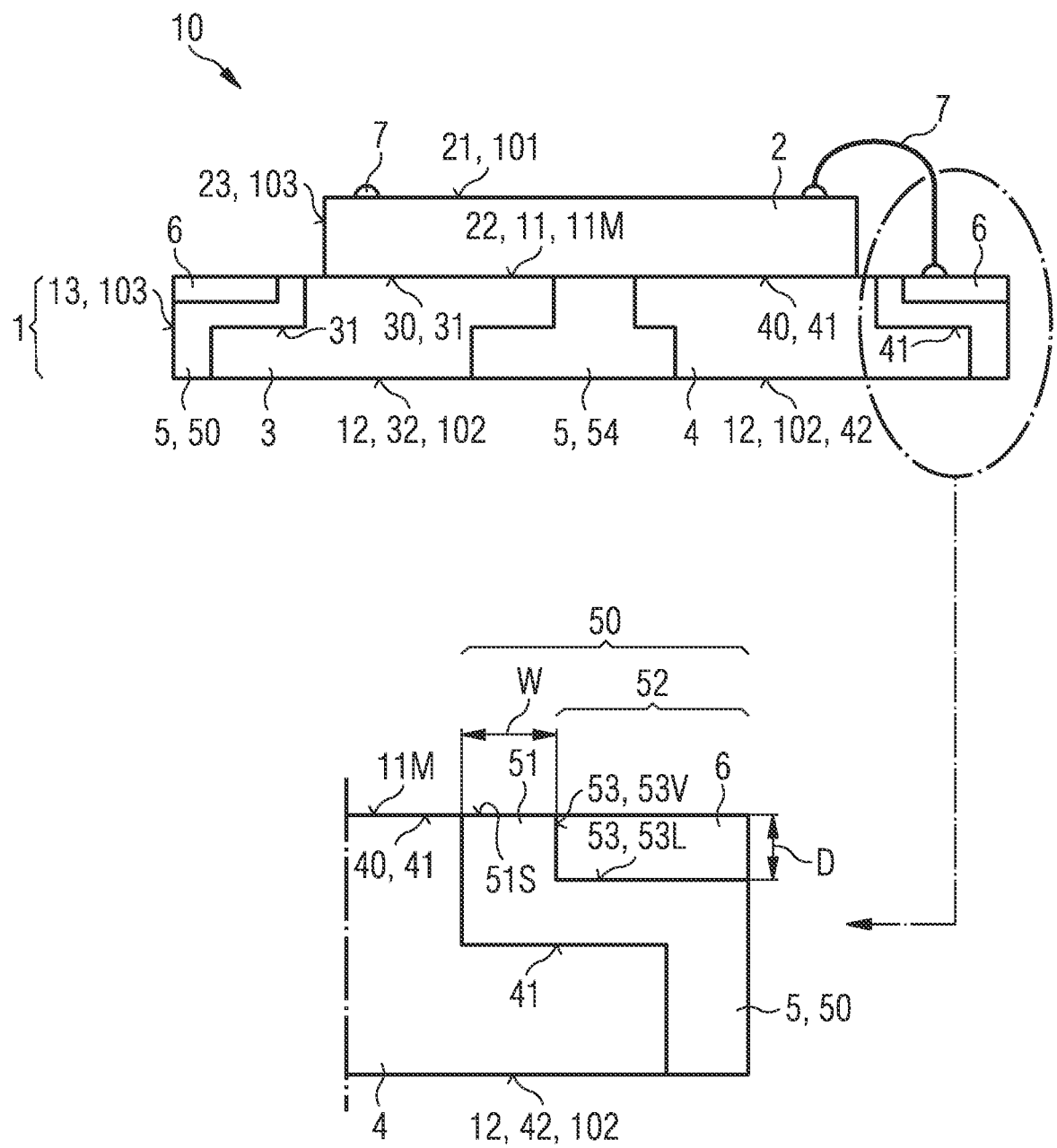
Figure 3A:
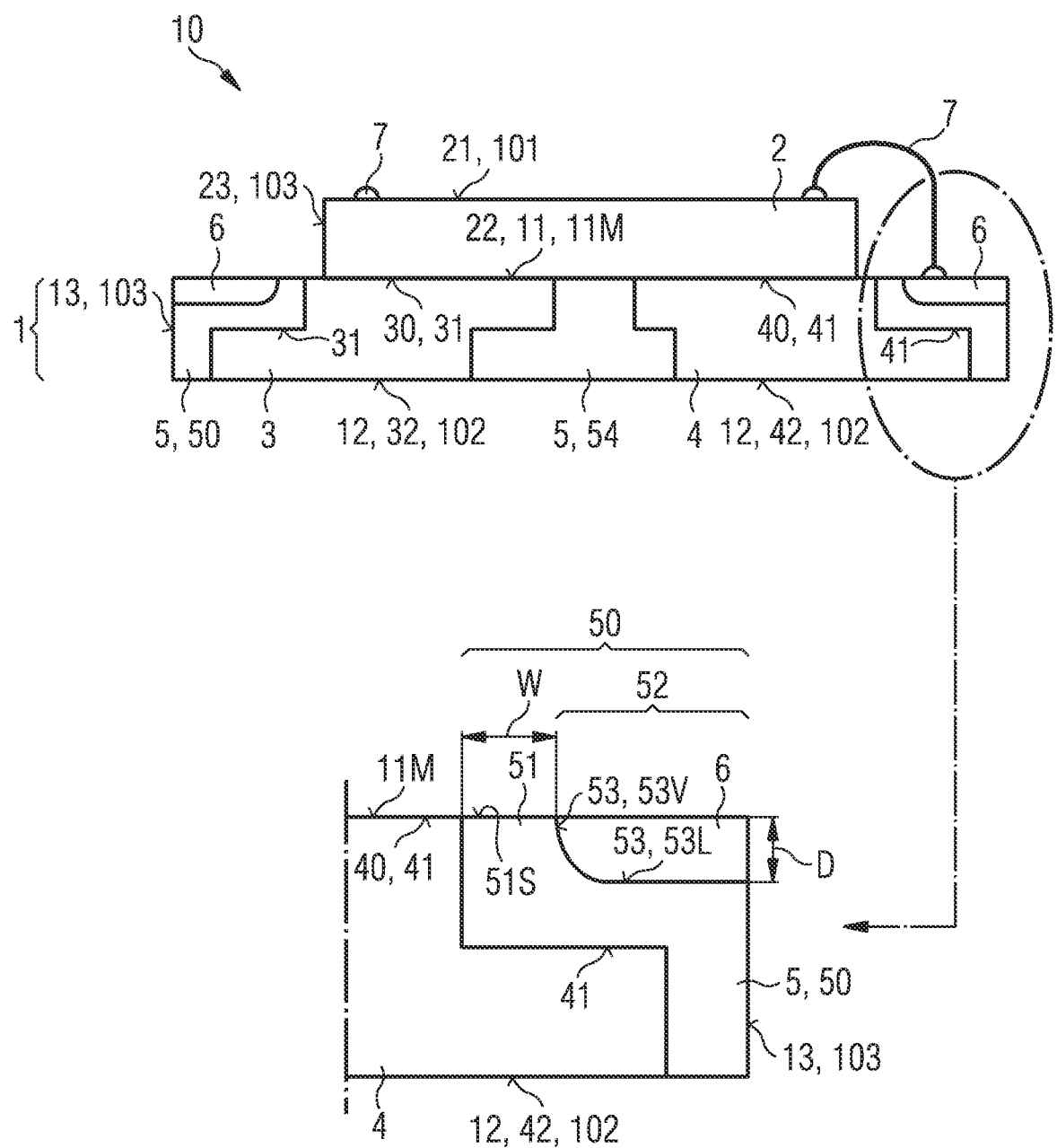
Figure 3B:
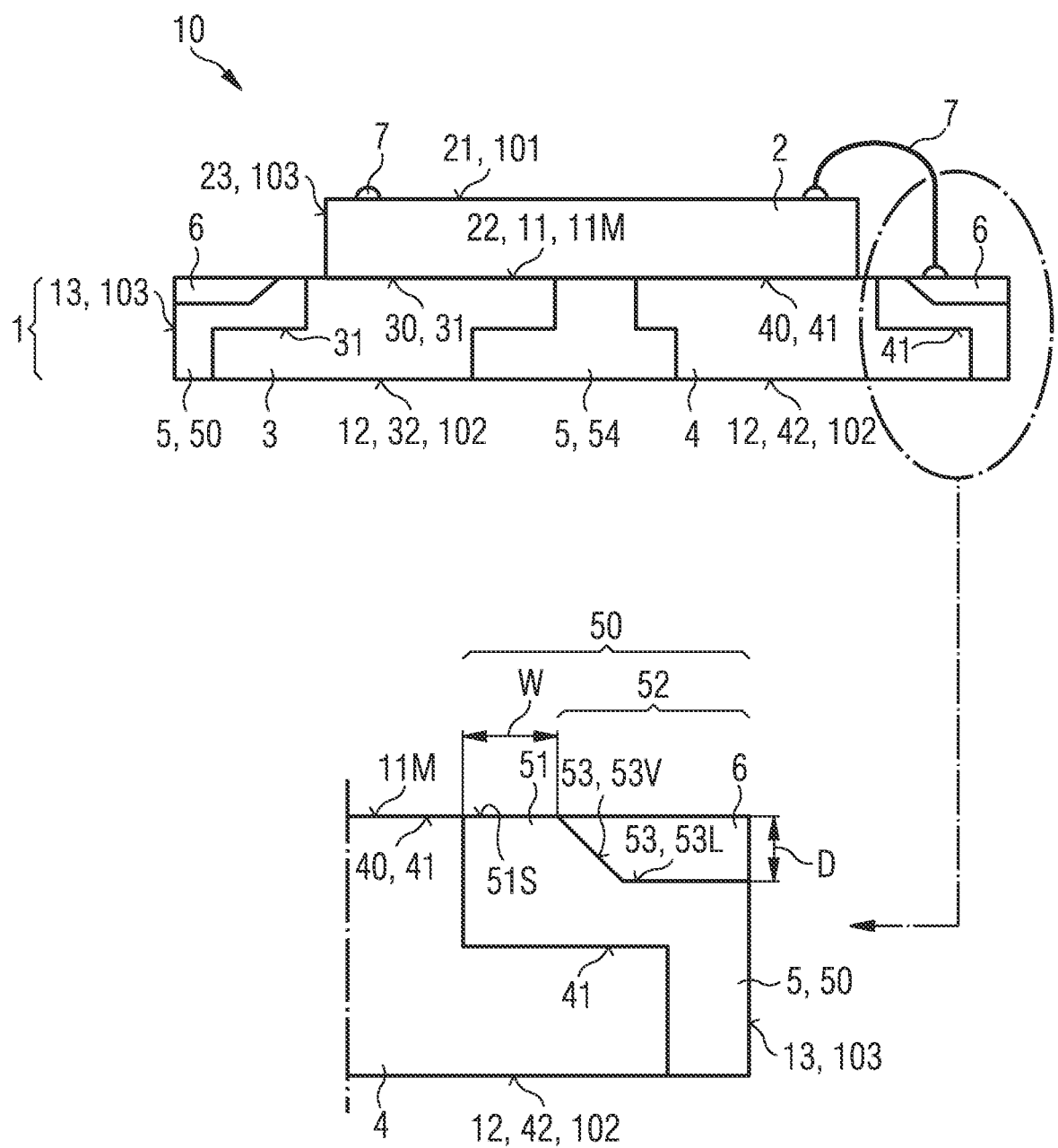
Figure 3C:
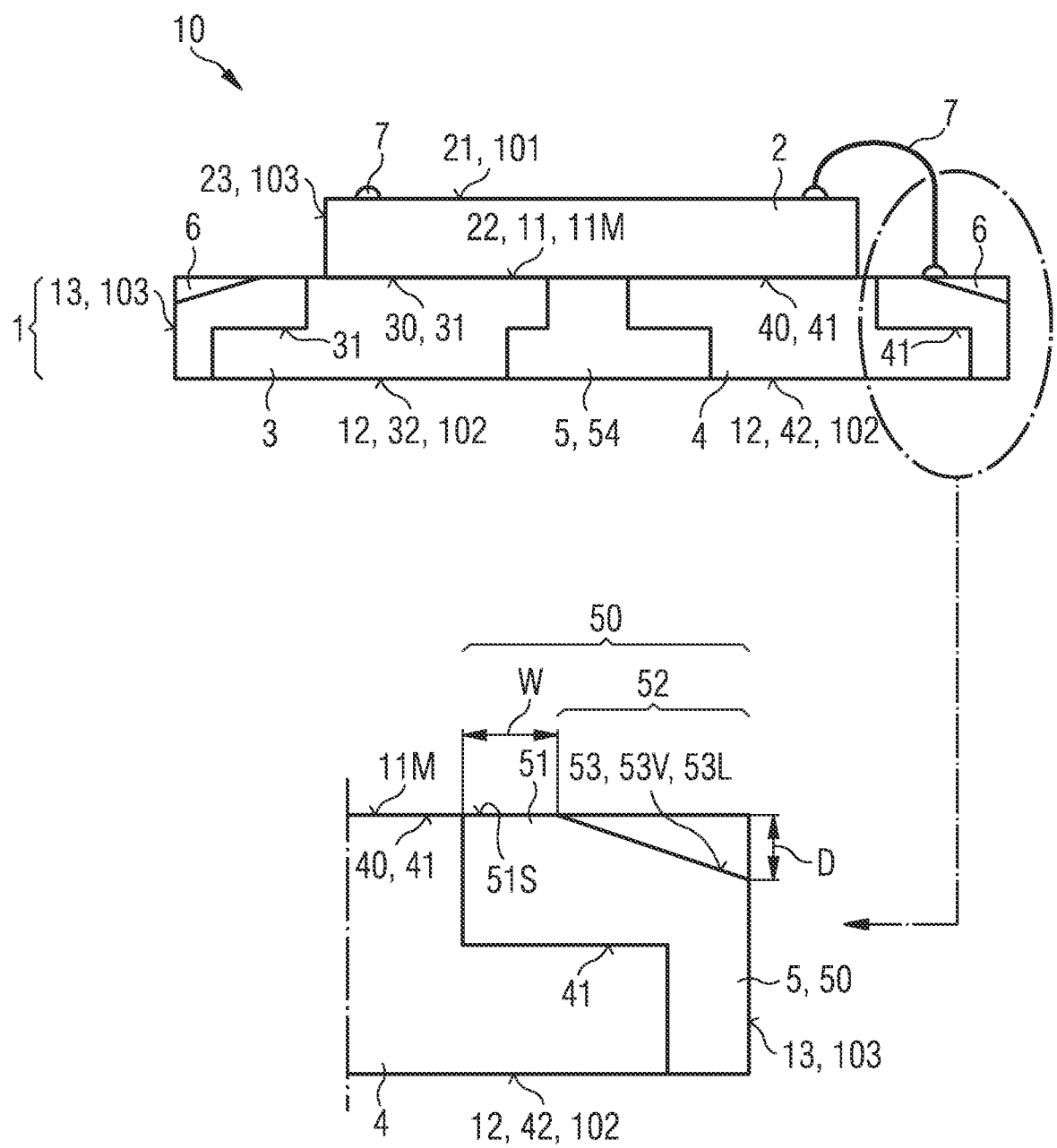
Figure 4:
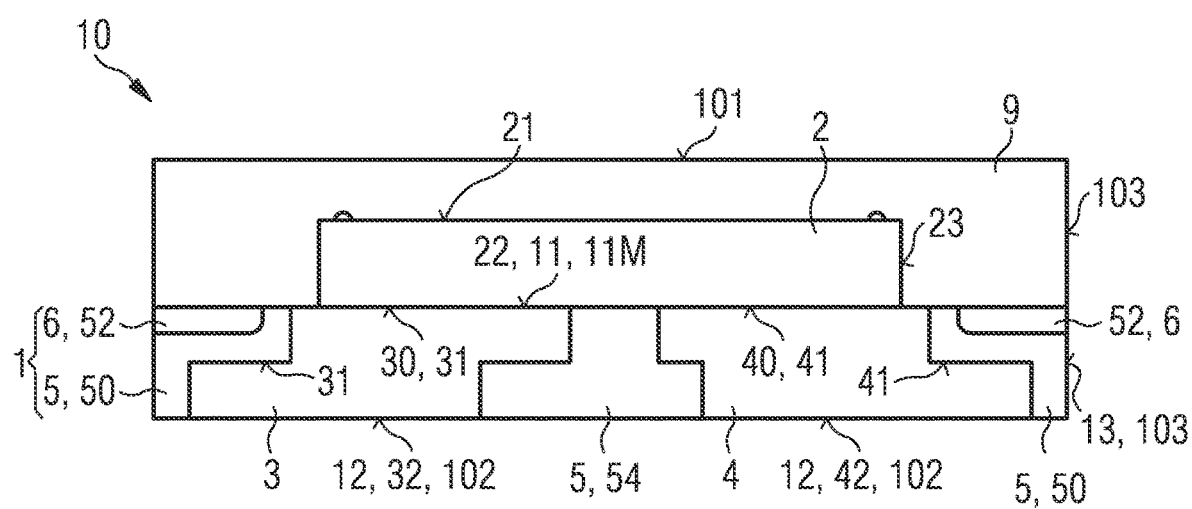
Figure 5A:
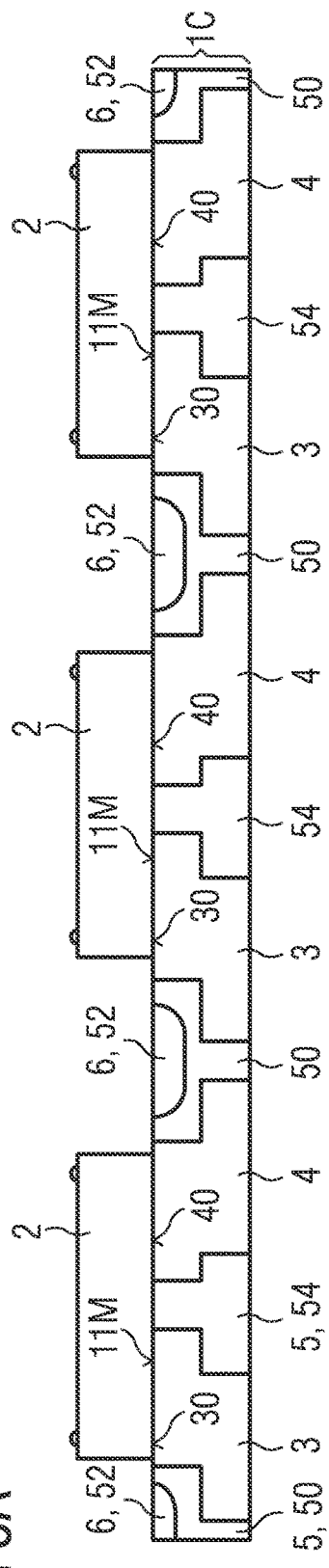
Figure 5B:
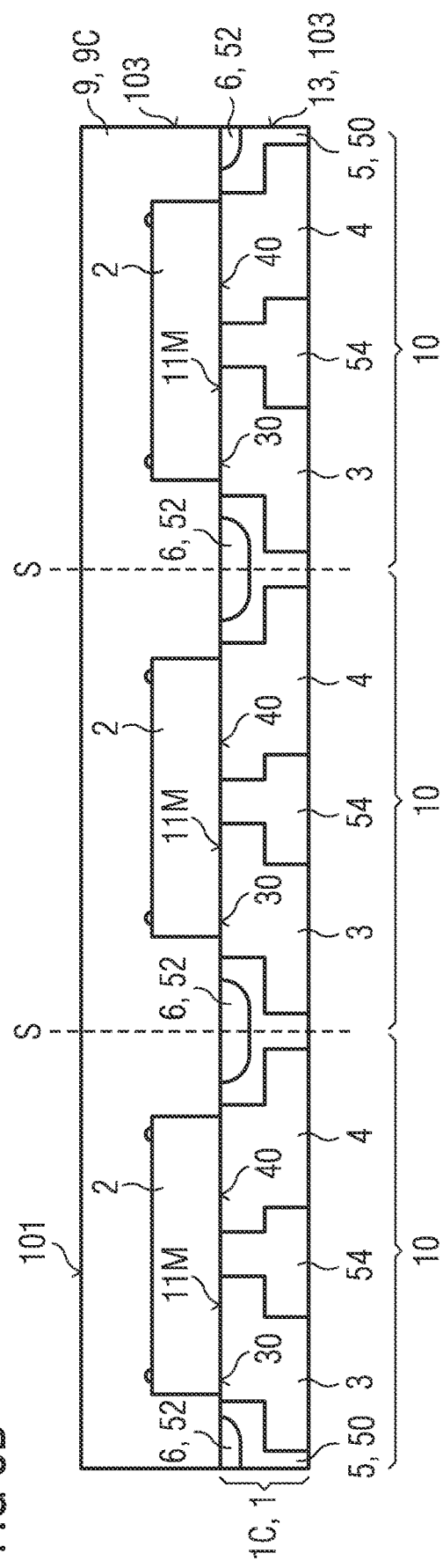

Further preferred embodiments and developments of the light-emitting component and/or of the method for producing the light-emitting component will emerge from the embodiments explained hereinafter in conjunction with FIGS. 1A to 5B, in which:

FIGS. 1A and 1B show schematic illustrations of a comparative embodiment of a light-emitting component in sectional view and in top view, FIGS. 2A and 2B show schematic illustrations of an exemplary embodiment of a light-emitting component in sectional view and in top view, FIGS. 3A, 3B, 3C, 3D, 3E and 3F show schematic illustrations of further exemplary embodiments of a light-emitting component in sectional views, FIG. 4 shows a schematic illustration of a further exemplary embodiment of a light-emitting component in sectional view, and FIGS. 5A and 5B show schematic illustrations of different steps of an exemplary embodiment of a method for producing a plurality of light-emitting components in sectional views.

Identical, equivalent or similarly acting elements of the component are provided with identical reference signs in the figures. The figures are each schematic illustrations and therefore are not necessarily true to scale. Rather, comparatively small elements and in particular layer thicknesses may be illustrated in an exaggerated manner for clarification.

FIG. 1A shows a schematic illustration of a comparative embodiment of a light-emitting component 10 in sectional view. The component 10 comprises a carrier 1 and a light source 2 being arranged on a mounting surface 11M of the carrier 1. The light source 2 is for example a light-emitting chip, in particular a semiconductor chip.

The component 10 has a front side 101 which may be formed by a front side 21 of the light-emitting chip 2. A rear side 102 of the component 10 is formed by a rear side 12 of the carrier 1. The carrier 1 comprises a first lead frame 3, a second lead frame 4 and a basic body 5. The first lead frame 3 and the second lead frame 4 may be laterally surrounded by the basic body 5 completely. The first lead frame 3 and/or the second lead frame 4 may have a step-like structure in particular on all side surfaces of the lead frames. In this way, an interface between the basic body 5 and the lead frame(s) 3 and/or 4 is enlarged, resulting in a strong adhesion between the basic body 5 and the lead frames.

For example, the first lead frame 3 and the second lead frame 4 are assigned to different electrical polarities of the component 10, wherein the lead frames 3 and 4 are spatially separated by an intermediate portion 54 of the basic body 5. The basic body 5 has an edge region 50 which laterally surrounds the lead frames 3 and 4 as well as the intermediate portion 54. The edge region 50 and/or the intermediate portion may have a step-like structure on their/its side surfaces facing the lead frames 3 or 4. The basic body 5 comprising the intermediate portion 54 and the edge region 50 may be formed in one piece. The component 10 has side surfaces 103 which may be formed by side surfaces 23 of the light source 2 and side surfaces 13 of the carrier 1. In particular, the surfaces 13 of the carrier 1 are formed by side surfaces of the basic body 5.

The first lead frame 3 has a front side 31 which is partially covered by the basic body 5. The uncovered portion of the front side 31 forms a first connection pad 30. The first lead frame 3 has a rear side 32 being remote from the front side 31, wherein the rear side 32 of the first lead frame 3 is exposed at least partially on the rear side 12 of the carrier or on the rear side 102 of the component 10. Along the vertical direction, the first lead frame 3 extends throughout the basic body 5.

The second lead frame 4 has a front side 41 which is partially covered by the basic body 5. The uncovered portion of the front side 41 forms a second connection pad 40. The second lead frame 4 has a rear side 42 being remote from the front side 41, wherein the rear side 42 of the second lead frame 4 is exposed at least partially on the rear side 12 of the carrier 1 or on the rear side 102 of the component 10. Along the vertical direction, the second lead frame 4 extends throughout the basic body 5.

The carrier 1 has a front side 11 facing a rear side 22 of the light source 2 and comprises surfaces of the basic body 5 and of the lead frames 3 and 4. The front side 11 has a subsection forming the mounting surface 11M. The mounting surface 11M comprises, for example exclusively comprises, the first connection pad 30, the second connection pad 40 and in particular a surface of the intermediate portion 54 of the basic body 5. The mounting surface 11M may laterally adjoin the edge region 50 directly. In top view, the mounting surface 11M may be surrounded and delimited by the edge region 50 of the basic body 5.

The light source 2 or the light-emitting chip 2 is fixed on the mounting surface 11M in particular in such a way that in top view the light source 2 overlaps with the first connection pad 30, the second connection pad 40 and the intermediate portion 54 of the basic body 5. By means of wirings 7, for example in the form of bonding wires, the light source 2 may be electrically connected to the connection pads 30 and 40 and/or to the lead frames 3 and 4. The lead frames 3 and 4 are electrically connectable with an external source at the rear side 12 of the carrier 1 or at the rear side 102 of the component 10.

FIG. 1B shows a schematic illustration of the comparative embodiment of a light-emitting component 10 in top view. The light source 2, in particular the light-emitting chip 2, has a contact level 8 comprising a plurality of conductor tracks, which are regularly distributed on the front side 21. The conductor tracks assigned to the same electrical polarity may form a comb-shaped structure. The conductor tracks assigned to different electrical polarities are electrically connected to different wirings 7 at the front side 21.

In order to improve the efficiency of the component 10, those regions of the front side 11 of the carrier 1 which are not covered by the light source 2 may be formed to be highly reflective. For example, a reflective layer comprising white particles may be applied onto the front side 11 after the light source 2 has been fixed on the mounting surface 11M and/or has been electrically connected to the connection pads 30 and 40. It is, however, undesirable that highly reflective material of the reflective layer covers any part of the light source 2, for example the side surfaces 23 or the front side 21 of the light source 2. On the other hand, the material flow and the coverage area are difficult to control during by the process of applying the reflective layer, in particular during a dispensing process onto the front side 11 of the carrier 1 if the mounting surface 11M and surfaces of the basic body 5, in particular of the edge region 50 of the basic body 5, are at the same, or substantially at the same vertical level. In this case, material of the reflective layer may flow to bottom edges of the light source 2 and creep to the side surfaces 23.

FIG. 2A schematically illustrates an exemplary embodiment of the light-emitting component 10 in sectional view. This exemplary embodiment substantially corresponds to the comparative embodiment of the component 10 in FIGS. 1A and 1B. In this sense, features described in connection with the component 10 in FIGS. 1A and 1B can also be used for the light-emitting component 10 as shown in FIG. 2A. This also applies to the further embodiments of the component 10 disclosed in FIGS. 2B to 4.

In contrast to the component 10 as shown in FIGS. 1A and 1B, the light-emitting component 10 according to FIG. 2A comprises a reflective layer 6. The reflective layer 6 is restricted in particular within a recess 52 of the basic body 5. The recess 52 is situated at the edge region 50 of the basic body 5. In top view, the recess 52 may laterally surround the mounting surface 11M completely.

The edge region 50 of the basic body comprises a spacer 51, wherein in top view, as shown in FIG. 2B, the spacer 51 surrounds the mounting surface 11M completely. The spacer 51 may directly adjoin the mounting surface 11M and/or the reflective layer 6. In particular, the reflective layer 6 extends along the lateral direction from the spacer 51 as far as the side surfaces 13 of the carrier 1 or the side surfaces 103 of the component 10.

The spacer 51 together with the intermediate portion 54 of the basic body 5 may be formed in one piece. In top view, the spacer 51 is arranged between the reflective layer 6 and the mounting surface 11M. The spacer 51 has a lateral width W or an average lateral width W which is for example at least 20 μm or at least 50 μm. The spacer 51 having this lateral distance or this gap between the reflective layer 6 and the lead frame 3 or 4 may accommodate the roughness on surfaces of the lead frame 3 or 4; said roughness may emerge as a result of metal etching tolerances. Moreover, the gap of at least 50 μm is also in accordance with current mold tool design. Since the reflectivity of the reflective layer 6 is usually higher than that of the mounting surface 11M or of the basic body 5, it is desirable to keep the spacer 51 narrow. For instance, the lateral width of the spacer 51 is at most 300 μm, 200 μm, 150 μm, 100 μm or 70 μm.

The spacer 51 has a top surface 51S. The top surface 51S and the mounting surface 11M are at the same, or substantially at the same vertical level. Thus, within the scope of the production tolerances, the top surface 51S of the spacer 51 and the mounting surface 11M close flush with each other along the vertical direction. The production tolerances may be a few microns, for example 1 μm, 3 μm, 5 μm, 10 μm, 20 μm, 30 μm or 50 μm at most. In other words, two surfaces or layers are said to close flush with each other, when they close with each other in one plane with a tolerance of 1 μm, 3 μm, 5 μm, 10 μm, 20 μm, 30 μm or 50 μm at most.

The recess 52 has a base surface 53. The base surface 53 extends along the lateral direction from the spacer 51 in particular as far as side faces 13 of the carrier 1. The base surface 53 may comprise a first vertically extending section 53V and a second laterally extending section 53L. The first section 53V extends along the vertical direction for example from the second section 53L as far as the top surface 51S of the spacer 51, i.e. as far as the laterally extending surface 51S of the spacer 51. The top surface 51S of the spacer 51 and/or the mounting surface 11M are/is vertically elevated with respect to the base surface 53 of the recess 52 at least in places. For example the top surface 51S and/or the mounting surface 11M are/is vertically elevated with respect to the laterally extending section 53L of the base surface 53 by at least 30 μm, 50 μm, 70 μm or 90 μm and/or by at most 180 μm, 200 μm, 300 μm, 400 μm or 500 μm. This corresponds to the depth D of the recess 52. The top surface 51S is not covered by the reflective layer 6. In this way, material of the reflective layer 6 is prevented from creeping onto the mounting surface 11M or onto the light source 2. In other words, the light source 2 and the mounting surface 11M are not covered by the reflective layer 6.

In FIG. 2B, the spacer 51 and the recess 52 form a step on the surface of the basic body. The step of the basic body has a top terrace formed by the top surface 51S of the spacer 51, a bottom terrace formed by the laterally extending section 53L of the base surface 53, and a vertical portion formed by the vertically extending section 53V of the base surface 53, wherein the vertical portion connects the bottom terrace to the top terrace. The section 53L and the section 53V form a right angle or an angle of 90° with a tolerance of 5° or 10° at most. The lead frame 3 or 4 also comprises a step on its front side 31 or 41 or on its side surfaces, wherein the step of the lead frame 3 or 4 also comprises a top terrace, a bottom terrace and a vertical portion. In particular, the top terrace may be part of the mounting surface 11M. In top view, the step of the basic body 5 is formed on the bottom terrace of the step of the first lead frame 3 and/or of the second lead frame 4.

In order to maximize the total surface of the basic body 5 which is covered by the reflective layer 6, the first lead frame 3 and/or the second lead frame 4 may be structured in such a way that the first connection pad 30 and/or the second connection pad 40 are adapted to the size of the light source 2. For example, the connection pads 30 and 40 are adapted to the light source 2 in such a way that at least 60%, 70%, 80%, 85% or at least 90% of the total surface of the connection pads 30 and 40 are covered by the light source 2.

The connection pads 30 and 40 are made of metals and usually have a maximum reflectivity of 88% or less. The reflective layer 6, on the other hand, may have a reflectivity of 90%, 92% or more. In particular, the material composition of the reflective layer 6 may be chosen in such a way that the reflectivity of the reflective layer 6 is higher than the reflectivity of the connection pads 30 and 40, for example by at least 2%, 4%, 6% or by at least 10%. By reducing the surfaces of the connection pads 30 and 40, the total surface which is covered by the reflective layer 6 can be enlarged. Preferably, the light source 2 is fixed on the mounting surface 11M in such a way that in top view the light source 2 overlaps the first and second lead frames 3 and 4 and/or the first and second connection pads 30 and 40. In this way, the total surface of the first and second connection pads 30 and 40 can be reduced.

In comparison to the component 10 in FIG. 1B, the lead frames 3 and 4 as shown in FIG. 2B are structured, for instance by means of an etching process, in particular in regions which are not used for fixing or electrically contacting the light source 2. Hereby, the total area of the connection pads 30 and 40 may be reduced by about 17%. As a result, the total surface of the edge region 50 which may be covered by the reflective layer 6 is increased. In FIG. 2B each of the first and second connection pads 30 and 40 has only one single wire-attaching section, where the wiring 7 ends, wherein the wire-attaching section projects laterally beyond the rest of the corresponding connection pad.

According to FIG. 2B, about 63% of the total surface of the basic body 5 are covered by the reflective layer 6. This ratio of coverage is higher than that of the embodiment according to FIG. 1B.

FIG. 3A schematically illustrates a further exemplary embodiment of the light-emitting component 10 in sectional view which substantially corresponds to the embodiment in FIG. 2A. In contrast thereto, the vertically extending section 53V of the base surface 53 is curved, in particular concavely curved. For example, a curvature radius of the base surface 53 and/or of the vertically extending section 53V of the base surface 53 is 50 µm or larger, for instance between 50 µm and 300 µm inclusive.

FIG. 3B schematically illustrates a further exemplary embodiment of the light-emitting component 10 in sectional view which substantially corresponds to the embodiment in FIG. 2A. In contrast thereto, the vertically extending section 53V of the base surface 53 is slanted with respect to the top surface 51S of the spacer 51 and/or to the laterally extending section 53L of the base surface 53. In other words, the vertically extending section 53V of the base surface 53 forms a chamfer. The chamfer may have an angle of inclination of between 20° and 70° inclusive, for example of 45°. In this case, the section 53V and the section 53L or the section 53V and the top surface 51S may form an angle of 135°+/−25°.

FIG. 3C schematically illustrates a further exemplary embodiment of the light-emitting component 10 in sectional view which substantially corresponds to the embodiment in FIG. 3B. In contrast thereto, the entire base surface 53 is slanted with respect to the top surface 51S of the spacer 51. The spacer and the recess 52 together have the form of a V-groove step. The base surface 53 and the top surface 51S may form an angle of 135°+/−25°.

FIG. 3D schematically illustrates a further exemplary embodiment of the light-emitting component 10 in sectional view which substantially corresponds to the embodiment in FIG. 3A. In contrast thereto, the vertically extending section 53V of the base surface 53 is convexly curved. For example, a curvature radius of the vertically extending section 53V of the base surface 53 is 50 µm or larger, for instance between 50 µm and 300 µm inclusive.

FIG. 3E schematically illustrates a further exemplary embodiment of the light-emitting component 10 in sectional view which substantially corresponds to the embodiment in FIG. 3A. While in FIGS. 3A, 3B, 3C und 3D, in a top view onto the carrier 1, the top surface 51S, i.e. the laterally extending surface 51S of the spacer 51, and the base surface 53 are free of overlaps, in FIG. 3E the top surface 51S of the spacer 51 and the base surface 53 of the recess 52 overlap each other in places. In particular, the vertically extending section 53V of the base surface 53 is covered by the top surface 51S completely. It is, however, also possible that the vertically extending section 53V of the base surface 53 is covered by the top surface 51S of the spacer 51 only in places.

FIG. 3F schematically illustrates a further exemplary embodiment of the light-emitting component 10 in sectional view which substantially corresponds to the embodiment in FIG. 3B. In contrast thereto, the section 53V and the section 53L or the section 53V and the top surface 51S may form an angle of 45°+/−25°. Moreover, similar to the embodiment disclosed in FIG. 3E, in a top view onto the carrier 1, the vertically extending section 53V of the base surface 53 may be covered by the top surface 51S of the spacer 51 completely or only in places.

FIG. 4 schematically illustrates a further exemplary embodiment of the light-emitting component 10 in sectional view which substantially corresponds to the embodiment in FIG. 2A. In contrast thereto, the component comprises a radiation-transmissive encapsulation layer 9 which—in top view—may cover the carrier 1, the reflective layer 6 and the light source 2 completely. In lateral directions, the light source 2 may be completely surrounded by the encapsulation layer 9. In this case, the front side 101 of the component 10 is formed by a surface of the encapsulation layer 9. The side surfaces 103 of the component 10 may be formed by side surfaces of the encapsulation layer 9 and by the side surfaces 13 of the carrier 1. The side surfaces 13 of the carrier 1 may be formed by surfaces of the basic body 5 and/or of the reflective layer 6.

Preferably, the encapsulation layer 9 is made of silicone. It is possible that scattering particles and/or light-converting particles are embedded in the encapsulation layer 9. In particular, the reflective layer 6 also comprises silicone. The encapsulation layer 9 preferably adjoins the reflective layer 6 for forming a silicone-silicone-interface.

In further contrast to FIG. 2A, it is possible that the light source 2 or the light-emitting chip 2 is electrically connectable at its rear side 22. In other words, the light source 2 is a surface-mountable light source which may be electrically connected to the connection pads 30 and 40 and/or to the lead frames 3 and 4 at the overlapping regions between the light source 2 and mounting surface 11M. In this case, the front side 21 of the light source may be free of any electrical contacts. Moreover, the wirings 7 may be omitted.

It is possible that all embodiments of the light-emitting component 10 as disclosed in FIGS. 2A to 3F comprise the encapsulation layer 9 and the surface-mountable light source 2 as disclosed in FIG. 4.

FIGS. 5A and 5B show some steps of an exemplary embodiment of a method for producing a plurality of light-emitting components 10 in sectional views.

In FIG. 5A, a common carrier 1C having a plurality of mounting surfaces 11M is provided. The common carrier 1C comprises a plurality of lead frames 3 and 4. For example, the common carrier 1C has a basic body 5, in particular a common basic body 5, which surrounds the lead frames 3 and 4 laterally. The basic body 5 may be formed in one piece. Preferably, the basic body 5 is formed from a casting compound, in particular from an epoxy resin mold compound.

The plurality of mounting surfaces 11M may be arranged in a matrix-like structure, i.e. in rows and columns. The basic body 5 may have a single recess 52 or a plurality of recesses 52 which are formed between the rows and/or columns of the mounting surfaces 11M. The recesses 52 may be connected to each other resulting in a matrix-like structure when seen from a top view. Along two neighboring rows or columns of the mounting surfaces 11M, the recess 52 may cover two neighboring rows or columns of the lead frames 3 or 4.

The recess 52 or recesses 52 may be filled with a highly reflective material for example by a dispensing process, in particular after a plurality of light sources 2 have been mechanically fixed on the mounting surfaces 11M and/or have been electrically connected for instance to the lead frames 3 and 4. Preferably, the highly reflective material is applied only to cover the base surfaces 53 of the recesses 52. In this way, the reflective layer 6 is formed only outside the mounting surfaces 11M.

In particular after the reflective layer 6 has been cured, a common encapsulation layer 9C is applied onto the common carrier 1C for instance by a molding process such as compression molding. The common encapsulation layer 9C may cover the light sources 2 and the reflective layers 6 completely.

According to FIG. 5B, the common encapsulation layer 9C and the common carrier 1C may be singulated along separation lines S into a plurality of light-emitting components 10, wherein each light-emitting component 10 may comprise one carrier 1, at least one light source 2 and one reflective layer 6. Preferably, each of the separation lines S runs through the recess 52 or the recesses 52 being covered by the reflective layer 6. Moreover, each of the separation lines S may run between two lines of the lead frames 3 and 4. In this way, the common carrier 1C is separated into a plurality of carriers 1 only by separating the reflective layer 6 and the basic body 5. Each of the components 10 may have side surfaces 103 showing singulation traces. In particular, the reflective layer 6 is exposed in places on the side surfaces 103.

The current package is still not able to meet the target of at least 200 lm/W, which is about 2% increment from current design. By reducing the total surface of the connection pads 30 and 40, which usually have a reflectivity of 88% or less, and/or applying the reflective layer 6, which has a higher reflectivity than the connection pads 30 and 40, on a larger surface of the carrier 1, the additional 2% lumen output in particular on flat-molded packages can be provided, making an efficiency of at least 200 lm/W achievable.

The invention is not limited to the exemplary embodiments as a result of the description of the invention on the basis of said exemplary embodiments. Rather, the invention includes any novel feature and any combination of features in particular including any combination of features in the claims, even if this feature or this combination itself is not explicitly specified in the claims or exemplary embodiments.

REFERENCES 10 light-emitting component
101 front side of the component
102 rear side of the component
103 side surface of the component
1 carrier
1C common carrier
11 front side of the carrier
11M mounting surface of the carrier
12 rear side of the carrier
13 side surface of the carrier
2 light source
21 front side of the light source
22 rear side of the light source
23 side surface of the light source
3 first lead frame
30 first connection pad
31 front side of the first lead frame
32 rear side of the first lead frame
4 second lead frame
40 second connection pad
41 front side of the second lead frame
42 rear side of the second lead frame
5 basic body of the carrier
50 edge region of the basic body
51 spacer
51S laterally extending surface of the spacer
52 recess
53 base surface of the recess
53V vertically extending section of the base surface
53L laterally extending section of the base surface
54 intermediate portion of the basic body
6 reflective layer
7 bond wire
8 contact level of the light source
9 encapsulation layer
9C common encapsulation layer
D vertical depth of the recess
W lateral width of the spacer
S separation line

The invention claimed is:

1. A light-emitting component comprising a carrier, a reflective layer and a light source, wherein
the light source is mechanically fixed on a mounting surface of the carrier,
the carrier has an electrically isolating basic body comprising an edge region, said edge region bounding the mounting surface,
the edge region comprises a recess, wherein the reflective layer covers a base surface of the recess, and
the mounting surface is vertically elevated with respect to the base surface of the recess at least in places, such that the reflective layer is kept away from the mounting surface.

2. The component according to claim 1, wherein the electrically isolating basic body is an epoxy resin mold compound.

3. The component according to claim 1, wherein the mounting surface accounts for between 30% and 60% of a total surface of the carrier.

4. The component according to claim 1, wherein the electrically isolating basic body and the reflective layer close flush with one another laterally.

5. The component according to claim 1, comprising a radiation-transmissive encapsulation layer which covers the carrier, the reflective layer and the light source completely, wherein
the encapsulation layer is made of silicone,
the reflective layer comprises silicone and white particles dispersed therein, and
the encapsulation layer adjoins the reflective layer.

6. A method for producing the light-emitting component according to claim 1, comprising:
fixing the light source on the mounting surface of the carrier; and
applying the reflective layer onto the edge region of the electrically isolating basic body after electrically contacting the light source in such a way that the reflective layer does not cover the mounting surface and/or the light source.

7. A method for producing a plurality of light-emitting components according to claim 1, comprising:
forming a plurality of recesses on the basic body of a common carrier, such that the recesses surround a plurality of mounting surfaces on the common carrier;
fixing a plurality of light sources on the plurality of mounting surfaces;
filling the recesses with the reflective layer;
applying a common encapsulation layer on the common carrier by a molding process, such that the common encapsulation layer covers the light sources and the reflective layers completely; and
singulating the common encapsulation layer and the common carrier along the recesses into a plurality of light-emitting components, wherein each light-emitting component comprises one carrier, one light source and one reflective layer.

8. The component according to claim 1, wherein
the reflective layer is electrically isolating and comprises a matrix material having white particles embedded therein, and
the proportion of white particles within the matrix material is chosen such that the reflective layer has a reflectivity of greater than 90%.

9. The component according to claim 8, wherein the white particles are $TiO_2$-particles and the matrix material is made of silicone.

10. The component according to claim 1, wherein
the carrier comprises a first lead frame and a second lead frame, wherein the basic body is formed as one piece and surrounds the first lead frame as well as the second lead frame in lateral directions,
the first lead frame and the second lead frame extend throughout the basic body and are electrically contactable on a rear side of the carrier, and
the mounting surface is remote from the rear side and is formed in places by a surface of the first lead frame and/or by a surface of the second lead frame.

11. The component according to claim 10, wherein the basic body, the first lead frame and the second lead frame close flush with one another at least in places at the mounting surface.

12. The component according to claim 1, wherein the edge region comprises a spacer as part of the basic body, said spacer being arranged laterally between the mounting surface and the recess.

13. The component according to claim 12, wherein
the spacer and the recess adjoin each other,
the base surface of the recess extends along a vertical direction as far as a laterally extending surface of the spacer, and
in a top view onto the carrier, the laterally extending surface of the spacer and the base surface are free of overlaps.

14. The component according to claim 12, wherein
the spacer and the recess adjoin each other,
the base surface of the recess extends along a vertical direction as far as a laterally extending surface of the spacer, and
in a top view onto the carrier, the laterally extending surface of the spacer and the base surface of the recess overlap each other in places.

15. The component according to claim 12, wherein
the base surface comprises a vertically extending section and a laterally extending section,
the vertically extending section stretches along a vertical direction from the laterally extending section as far as a laterally extending surface of the spacer, and
the vertically extending section is convexly or concavely curved.

16. The component according to claim 12, wherein
the spacer and the recess form a step, and
a laterally extending surface of the spacer and the mounting surface are flush with each other.

17. The component according to claim 12, wherein the spacer has an average lateral width (W) of at least 20 μm.

18. The component according to claim 12, wherein in a top view onto the carrier, the recess extends from the spacer along at least one lateral direction as far as a side surface of the carrier and at least 60% of the electrically isolating basic body are covered by the reflective layer filling the recess at least partially.

* * * * *